US005097125A

United States Patent [19]

Gruen et al.

[11] Patent Number: 5,097,125

[45] Date of Patent: Mar. 17, 1992

[54] PHOTO ION SPECTROMETER

[75] Inventors: Dieter M. Gruen, Downers Grove; Charles E. Young, Westmont; Michael J. Pellin, Naperville, all of Ill.

[73] Assignee: ARCH Development Corporation, Chicago, Ill.

[21] Appl. No.: 45,586

[22] Filed: May 4, 1987

Related U.S. Application Data

[62] Division of Ser. No. 870,437, Jun. 4, 1986, Pat. No. 4,864,130.

[51] Int. Cl.[5] .......... H01J 37/147

[52] U.S. Cl. .......... 250/305; 250/396 R

[58] Field of Search .......... 250/305, 396 A, 361.1; 313/361.1

[56] References Cited

U.S. PATENT DOCUMENTS

| | | |
|---|---|---|
| 2,945,124 | 7/1960 | Hall et al. . |
| 3,342,993 | 9/1967 | O'Halloran et al. . |
| 3,376,449 | 4/1968 | Harrison . |
| 3,394,252 | 7/1968 | Gohlke et al. . |
| 3,501,631 | 3/1970 | Arnold . |
| 3,639,757 | 2/1972 | Caroll et al. . |
| 3,670,162 | 6/1972 | Elmore . |
| 3,685,085 | 8/1972 | Jaffa . |
| 3,699,330 | 10/1972 | McGinnis . |
| 3,731,211 | 5/1973 | Purser . |
| 3,735,128 | 5/1973 | Palmberg . |
| 3,757,115 | 9/1973 | Ball . |
| 3,793,063 | 2/1974 | Wiley . |
| 3,818,228 | 6/1974 | Palmberg .......... 250/305 |
| 3,880,609 | 4/1975 | Caddock . |
| 3,936,634 | 2/1976 | Fite . |
| 4,100,409 | 7/1978 | Brongersma . |
| 4,126,781 | 11/1978 | Siegel .......... 250/305 |
| 4,255,656 | 3/1981 | Barrie et al. .......... 250/305 |
| 4,427,457 | 1/1984 | Carlson et al. .......... 357/51 |
| 4,481,415 | 11/1984 | Takeda et al. . |

OTHER PUBLICATIONS

"Continuum Ionization Transition Probabilities of Atomic Oxygen", Samson et al., *Physical Review A* vol. 9, No. 6, Jun. 1974, pp. 2449-2452.

*Primary Examiner*—Bruce C. Anderson
*Attorney, Agent, or Firm*—Reinhart, Boerner

[57] ABSTRACT

A thin film structure for providing predetermined electric field boundary conditions. A thin film configuration is disposed on an insulator substrate in a selected spatial pattern with substantially uniform electrically resistive character in each of the different areas of the spatial pattern.

5 Claims, 8 Drawing Sheets

PHOTO ION SPECTROMETER

CONTRACTUAL ORIGIN OF THE INVENTION

The U.S. Government has rights in this invention pursuant to Contract No. W-31-109-ENG-38 between the U.S. Department of Energy and Argonne National Laboratory.

This is a divisional of co-pending application Ser. No. 870,437 filed on June 4, 1986 now U.S. Pat. No. 4,864,130.

BACKGROUND OF THE INVENTION

The present invention relates generally to a charged particle spectrometer. More particularly the invention relates to an ion spectrometer having a lens system configured to extract from a sample ionized atomic components having well controlled energy and also to provide precise spatial manipulation of the various ion beams, enabling highly sensitive detection of the ionized atomic components. Improvement of signal to noise ratio is also achieved by exciting the atomic components to autoionization states before performing energy and angular refocusing time of flight (hereinafter, "EARTOF") mass spectrometric analysis.

Significant advances have been made in the quantitative analysis of atomic components in a sample. For example, resonance ion spectrometers have demonstrated considerable sensitivity for the detection of atoms of a predetermined component. (See, for example, U.S. Pat. Nos. 4,442,354 and 3,987,302 (Hurst et al.) and U.S. patent application Ser. No. 691,825, which are incorporated by reference herein). In practice, however, these previous resonance ion spectrometers still have significant limitations in terms of achieving sensitivities in the part per trillion range because of severe difficulties encountered in discriminating low level signals to be measured from noise made up of competing, undesired and extraneous signals.

OBJECTS

It is therefore an object of the invention to provide an improved spectrometer for quantitative analysis of selected atomic components.

It is another object of the invention to provide a novel ion spectrometer wherein a predetermined electric field is applied to ions enabling improved detection sensitivity of selected atomic components from a sample.

It is an additional object of the invention to provide an improved resonance ion and an autoionization spectrometer wherein a pulsed electric field is applied to a sample for repelling unwanted ions prior to extraction of photo ions generated by laser beam pulse excitation of selected atomic components.

It is another object of the invention to provide an improved spectrometer lens system having appropriately shaped lens structures for minimizing the redeposition probability of unwanted impurities from the lens system onto a sample.

It is an additional object of the invention to provide a novel spectrometer lens system enabling both the focusing of a primary ion beam along a path perpendicular to a sample and extraction of ions from a sample along a path also perpendicular to the sample and leading to a detector at the end of the spectrometer.

It is a further object of the invention to provide an improved device for generating predetermined electric field boundary conditions to achieve a required electric field potential for the desired use, such as the EARTOF analysis. .

It is another object of the invention to provide a mass spectrometer construction having two complementary electrostatic analyzers with spherical electrical fields and an interposed telescopic lens for analyzing charged particle beams, such as the ionized selected atomic components.

A significant feature in accordance with the instant invention lies in the provision of an improved spectrometer having enhanced sensitivity for detecting selected atomic components of a sample. A lens system is configured to provide a predetermined slowly diminishing electric field region for a volume containing a large portion of the ionized form of the selected atomic components, thereby minimizing the energy spread of the volume of the ionized selected atomic components which are subsequently extracted for spectroscopic analysis, such as in an EARTOF spectrometer. The relatively small energy spread makes the spectroscopic analysis substantially more accurate and increases the signal to noise ratio. In another aspect of the invention, the lens system also applies a pulsed electric field to the sample to remove some of the unwanted secondary ions from the volume containing neutral ones of the selected atomic components prior to their ionization. The pulsed electric field also places some of the unwanted secondary ions into high energy escape orbits, causing the secondary ions to be rejected in subsequent stages of the spectrometer 10. Once the unwanted ions are removed from the volume, the selected atomic components are excited to an ionized state, including selected autoionization states which provide enhanced discrimination of unwanted ionized species.

In an additional aspect of the invention, the lens system is adapted to perform a number of different spatial manipulations of various charged particle beams. For example, the lens system can guide a primary ion beam perpendicular to the surface of the sample, while also adapted for extracting ions of the selected atomic component perpendicular to the sample surface along a path leading to the detector at the end of the spectrometer.

In a further aspect of the invention, the final stages of the lens system include two complementary spherical electric field sections. A preselected resistive thick film configuration is disposed on an insulator substrate for generating predetermined electric field boundary conditions for any one of a number of uses. In particular, the resistive thick film configuration is used in conjunction with the spherical electrostatic analyzers, achieving the required electric field potential necessary for accurate EARTOF spectrometer analysis and minimization of signal loss.

Further objects and advantages of the present invention, together with the organization and manner of operation thereof, will become apparent from the following detailed description of the invention when taken in conjunction with the accompanying drawings wherein like reference numerals designate like elements in the several views.

DETAILED DESCRIPTION OF THE PREFERRED EMBODIMENT

Figure 1:
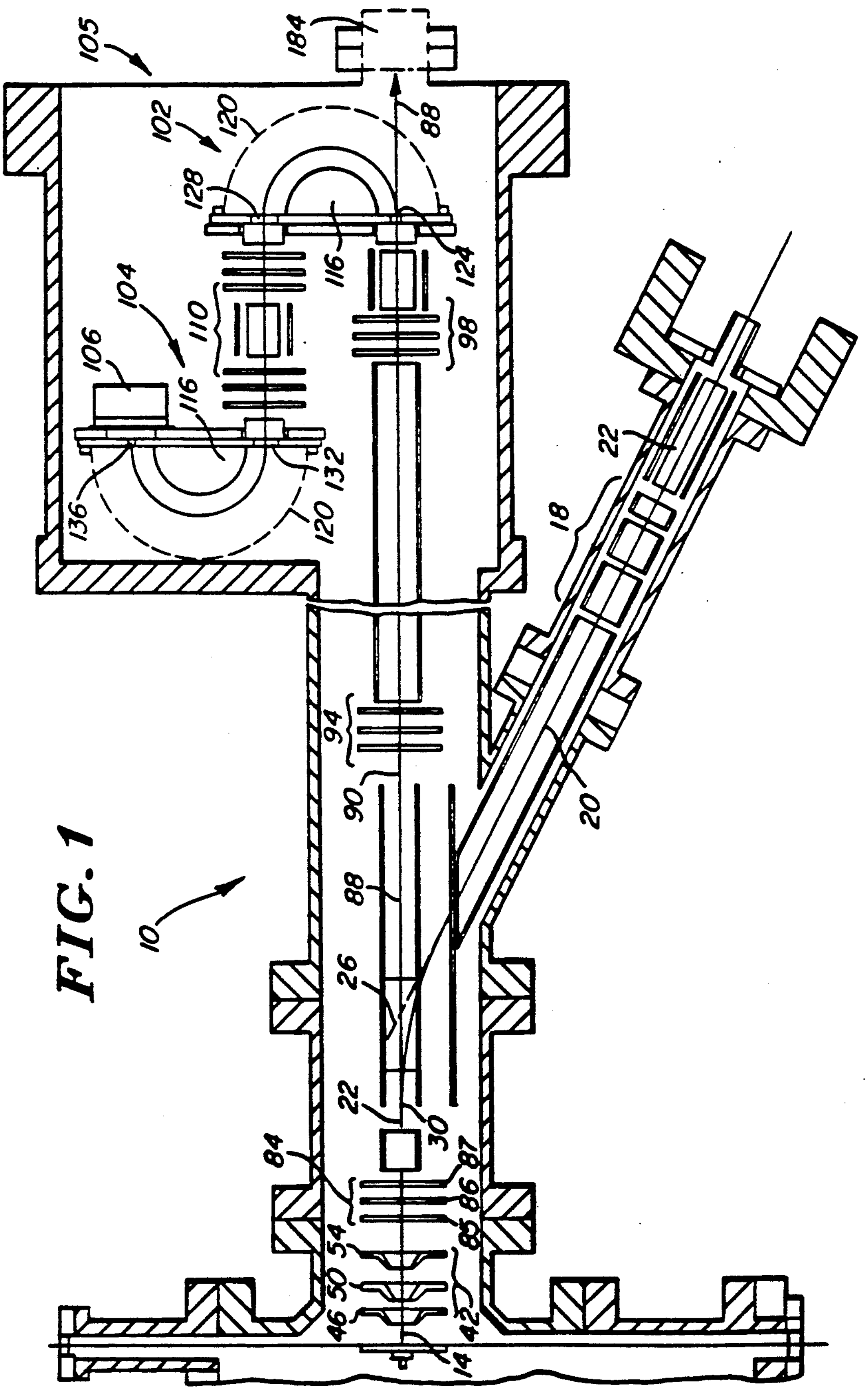
FIG. 1 illustrates an ion spectrometer constructed in accordance with one embodiment of the invention.
Figure 2:
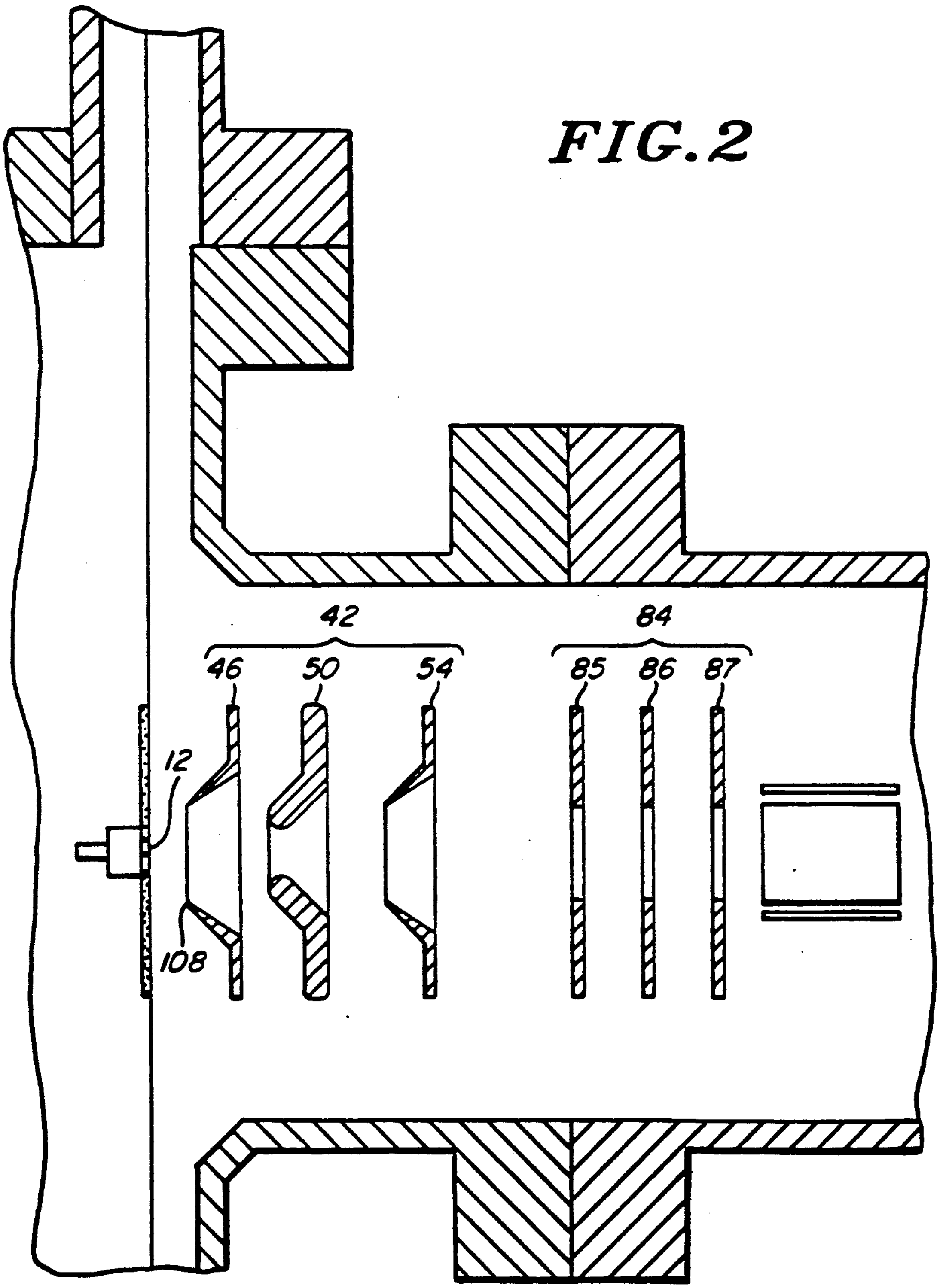
FIG. 2 shows a fragmentary view of the sample chamber and ion extraction region of the spectrometer of FIG. 1.
Figure 4:
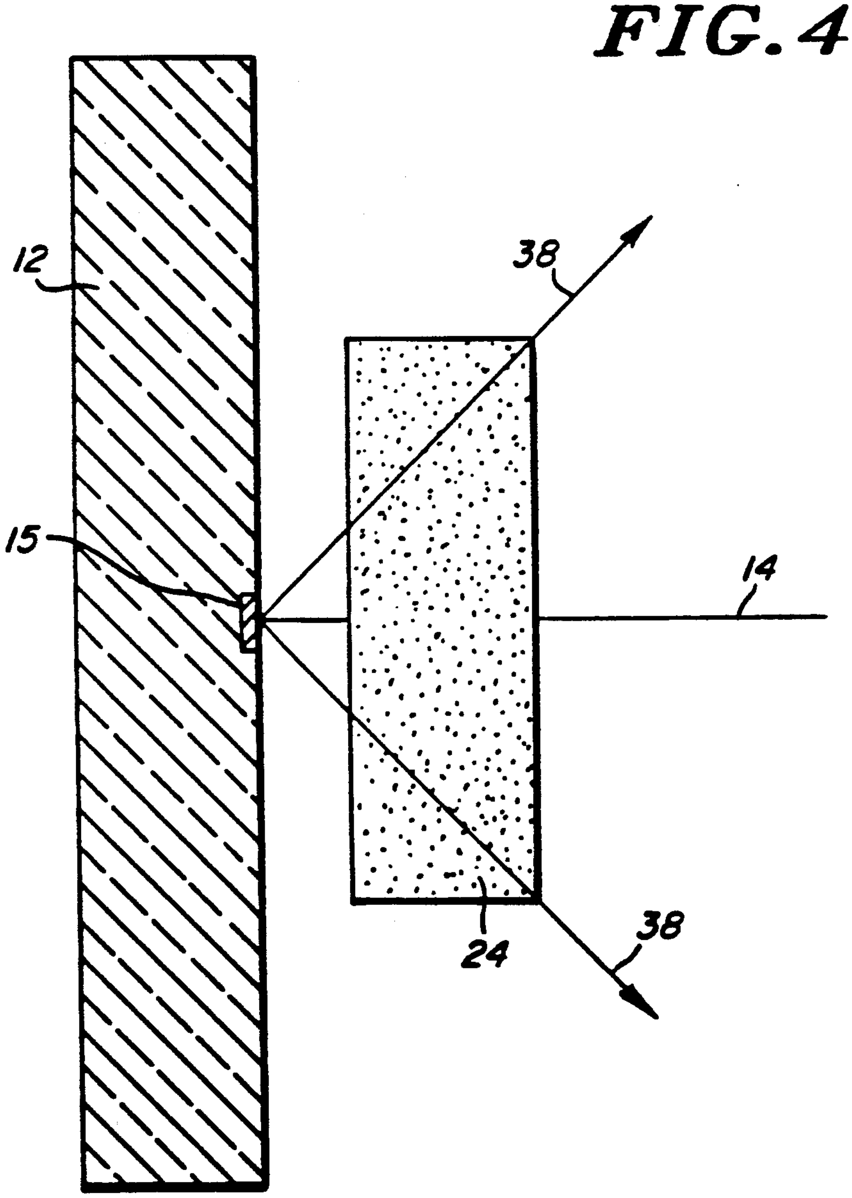
FIG. 4 is an enlarged fragmentary view of the sample area during generation of ions for analysis.
Figure 5:
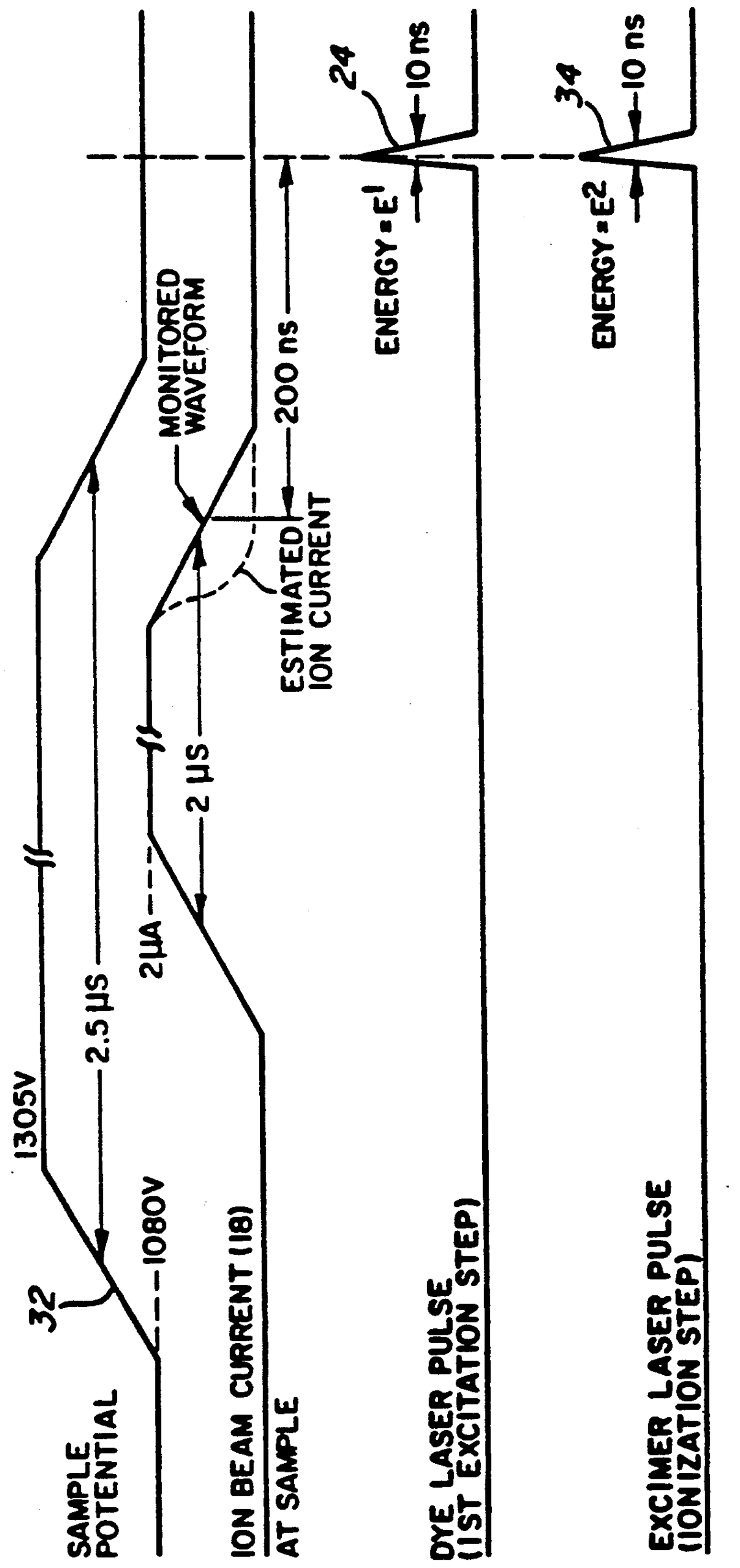
FIG. 5 illustrates a timing cycle for generation of an ionized beam of the selected atomic component.

Referring now to the drawings, and in particular to FIGS. 1 and 2, an improved ion spectrometer constructed in accordance with one embodiment of the present invention is indicated at 10. Very generally, the ion spectrometer 10 (hereinafter, the "spectrometer 10") includes a sample 14 disposed within a high vacuum (less than about $10^{-9}$ Torr.) provided by a conventional ultra high vacuum pumping system (not shown). Measurement of the quantity of a selected atomic component from the sample 14 is carried out by removing atoms for subsequent quantitative analysis. The selected atomic component is removed from the sample 14 by irradiating the sample 14 with an energetic particle beam, such as an ionized particle beam 18 (hereinafter, "primary ion beam 18") in the illustrated embodiment. A substantial portion of the selected atomic component removed from the sample 14 originates from a sample region 15, shown in FIG. 4, wherein the flux is highest from the primary ion beam 18. Typically, inert gas ions are used as the primary ion beam 18 and have an energy of 5 kV. The primary ion beam 18 is preferably a pulsed beam (see FIG. 5) in order to cooperate with other physical events (some of which are shown in FIG. 5), enabling performance of various functionalities to be described hereinafter. The primary ion beam 18 is deflected by deflector plates 22 from a first path 26 to a second path 30, which intersects the sample 14 substantially perpendicular thereto. In other forms of the invention the energetic particle beam can be other types of beams, such as, for example, a neutral particle beam, an electron beam, fission fragments or a photon beam, such as a laser beam. When the primary ion beam 18 strikes the sample 14, various atoms, including the selected atomic component, are ejected from the sample 14. A volume containing a number of the selected atomic component is therefore generated near the sample 14.

In order to remove unwanted ions from the volume containing the selected atomic component or to place ions at high energies leading to escape trajectories out of the spectrometer 10, a positive electric field potential 32 is generated on the sample 14. As shown in FIG. 5, the positive electric field potential 32 on the sample 14 is pulsed from about +1080 to +1350 volts prior to the arrival of the 5 kV pulsed primary ion beam 18 at the sample 14. The electric field potential 32 is maintained throughout the period of sputtering atoms from the sample 14. Thus, the positive electric field potential 32 acts to: (1) remove stray ions present before the sputtering of atoms (or ejection of the atoms by other means) from the sample 14, and also (2) to remove any secondary ions present as a consequence of the sample irradiation by the primary ion beam 18.

After removal of the unwanted ions from near the sample 14, the volume near the sample 14 contains as a residual various neutral forms of the selected atomic components which the operator desires to detect. These selected atomic components are, for example, single atoms and molecules. As shown in the view of FIG. 4, the volume containing a large portion of the selected atomic components near the sample 14 is irradiated to generate photo ions. In the illustrated embodiment (see FIGS. 4 and 5) the irradiation is performed by a laser beam pulse 34 shown in an end view cross section. As shown in FIG. 5 the laser beam pulse 34 is timed subsequent to the removal of unwanted ions from near the sample 14. As also noted in FIG. 5 the laser beam pulse 34 can comprise more than one pulse of different laser energies $E_1$ and $E_2$, and this aspect of the invention will be described in more detail below. A perimeter 38 of a 45° conical volume is illustrated in FIG. 4, and the conical volume encompasses about one half of the ions ejected from the sample region 15 of the sample 14, assuming a cosine type distribution of the ions relative to the axis defined by the beam path 30 for the primary ion beam 18. The laser beam pulse 34 is therefore positioned with respect to this distribution to excite the maximum possible percentage of the neutral selected atomic components ejected from the sample 14.

Creation of ions of the selected atomic components is an important early step toward the objective of isolating the desired signal from unwanted noise and extraneous signals measured during the final quantitative analysis. Therefore, sensitive analysis is commenced by the laser beam pulse 34 ionizing the selected atomic components to energies above the ionization potential (see FIG. 5). Significant further separation of the desired signal is achievable using two laser energies, $E_1$ and $E_2$ mentioned above, with the first part of the laser beam pulse 34 having an energy $E_1$ to selectively excite the selected atomic component to an energy below the ionization level. The second laser pulse 34 has the energy $E_2$ which ionizes the previously excited atomic component.

One form of excitation for $E_2$ is, for example, nonresonant excitation to the ionization continuum. Because the second laser energy at $E_2$ is not in energy resonance between an initial energy state and a final discrete state of the excited atomic component to be ionized, the cross section for the process is small; consequently, the power density required to saturate the ionization process is usually quite large. The required power can be achieved with large fixed-frequency lasers, but the drawback is that multiphoton non-resonant ionization of various unwanted species can become important. Although the multiphoton non-resonant ionization process may still have low probability relative to the single photon non-resonant ionization of the previously excited selected atomic component of interest, significant background ionization may still occur because of the much greater abundance of the majority species (e.g., atomic species of the matrix of the sample 14) in the ionization volume irradiated by the laser pulse 34.

A useful alternative for the second, ionization step at $E_2$ involves the application of specific wavelengths chosen to connect the excited atomic level at $E_1$, produced by irradiation from the first laser pulse 34, with photon energy $E_1$, to an autoionizing level of the selected atom component. States of the autoionization type are also conventionally called "discrete states embedded in the continuum", and have the property of rapidly decaying to an ion plus a free electron. Nevertheless, cross sections for excitation to these autoionization states are much larger than those for non-resonant ionization. Consequently, saturation of the second excitation step with energy $E_2$ is possible with the use of much less power density. This reduces the probability of ionizing majority unwanted species via multiphoton non-resonant ionization processes.

Alternative modes of laser induced ionization offer other features for performing analysis of the selected atomic component in the sample 14. In cases where the extreme sensitivity of resonance ionization (discussed above) is not required, multiphoton non-resonant ionization offers some advantages. Multiphoton non-resonant ionization refers to a physical process where more than one photon is absorbed by an atomic or molecular species, with all the photons being absorbed in a single step. To achieve the desired power levels, conventional focused, high power, non-tunable lasers are typically employed. Some of the advantages of operating in a multiphoton non-resonant ionization mode are:

(1) A rapid survey of possible impurity species of the selected atomic component in the sample 14 can be performed. Since ionization occurs without the necessity of tuning to energy resonances of each species individually of the selected atomic component, ion signals from neutral precursors of all elements present is obtained upon each occurrence of the laser pulse 34. Separation by mass is performable by a time of flight mass spectrometer alone.

(2) A semi-quantitative comparison of relative impurity abundances can be obtained immediately. The ion-production step is a laser-based, multiphoton ionization of gas phase species released from the sample by conventional ablation processes. Variation of ionization probability from one atomic species to another can be minimized and calibrated. Dependence on the chemical environment in the sample 14 is small since the process of sputtering material depends essentially on simple momentum-transfer considerations. In contrast, in other types of ion spectroscopy (such as secondary ion mass spectrometry (hereinafter, "SIMS") the ionization step iself occurs at the sample 14; and the ion production probability depends strongly on the chemical environment in the sample 14. Thus, quantitative SIMS is notoriously difficult to carry out.

(3) Molecular species can be detected. Compared with atomic species, molecular species released from the sample 14 are distributed among a relatively large number of energy levels. This distribution dilutes the population in any one state and is initially unknown. The task of studying each level with tuned resonance ionization is prohibitive. However, with non-resonant ionization, all these initial levels are ionized together. The occurrence of many intermediate near resonances in the molecular case facilitates the achievement of high ionization probability.

Figure 3:
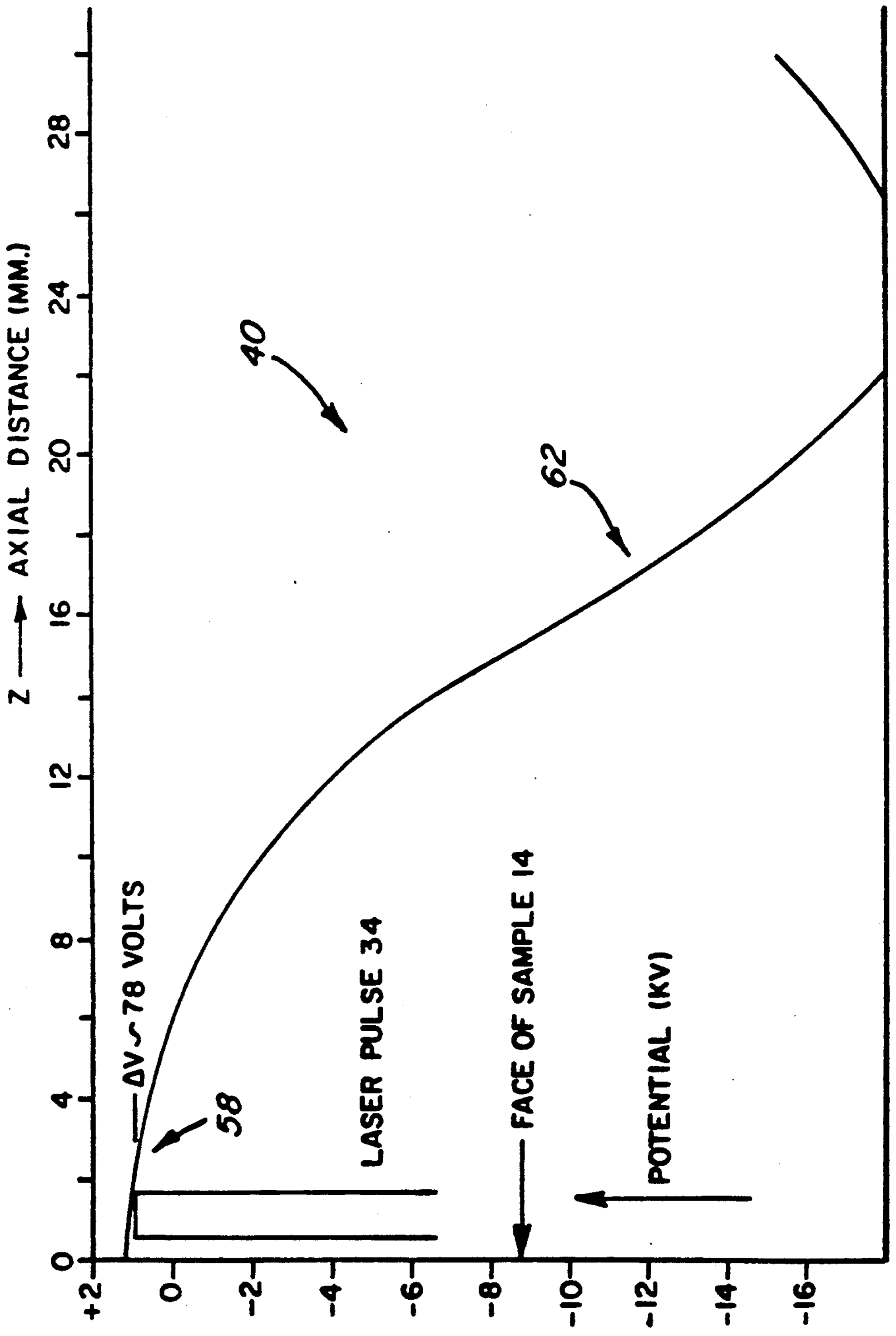
FIG. 3 illustrates a predetermined electric field as a function of perpendicular distance from the sample area shown in FIG. 2.

After generation of the ions of the selected atomic component, the ions undergo an extraction process which assists in improving the signal to noise ratio in the subsequent quantitative analysis. A predetermined electrical field 40 shown generally in FIG. 3, is generated by combining the electric field potential on the sample 14 with an electric field generated by electric field means, such as an extraction objective lens 42 having active lens elements 46, 50 and 54 (see FIG. 2). For example, the electrical field potential on the sample 14 is +1080 volts, and the potentials on the lens elements 46, 50 and 54 are +2300, −21,000 and −500 volts, respectively. The resulting predetermined electric field near the sample 14 has a potential of about +1080 volts at the sample 14 and a slowly diminishing field region 58 extending from the sample 14 over a preselected portion of the volume adjacent to the sample 14. The slowly diminishing electrical field derives primarily from the field penetration of the highly negative potential of the lens element 50. The field potential over the width of the cross section of the laser beam pulse 34 shown in FIG. 3, is about 78 volts but can be readily modified by manipulating the various potentials on the sample 14 and the lens elements 46, 50 and 54.

The final ions generated from the neutral atomic components within the slowly diminishing field region 58 have a relatively narrow spread of electric potential across the volume, enabling more complete transmission and improved accuracy of energy analysis of the ions in the step of quantitative EARTOF analysis. At the same time, the high negative potential on the lens element 50 also enables the efficient collection of the ions and leads to improved signal to noise ratio. The use of a high negative potential on the lens element 50 has further advantages associated with ion beam focusing. This latter feature will be discussed in more detail hereinafter.

Contiguous to the slowly diminishing field region 58 and extending along particular directions substantially outside the volume and away from the sample 14 is a rapidly diminishing field region 62 shown in FIG. 3. This strongly negative field region acts on the ions entering this region 62 and begins the ion extraction process. As mentioned above, the strong negative field helps increase the photo ion collection efficiency and improves consequent signal to noise ratio. Extraction of the photo ions is accomplished by an extraction lens system, which comprises the extraction objective lens 42 discussed hereinabove and a collimator lens system 84, having elements 85, 86 and 87.

During operation of the spectrometer 10, contaminants are deposited on surfaces near the sample 14, and can result in the generation of unwanted secondary ions and consequent detection of unwanted signals. These unwanted signals typically arise from deposition of material on portions of the extraction objective lens 42 and redeposition on the sample 14 as a contaminant, which is uncharacteristic of the true sample chemistry. These unwanted signals can be reduced by minimizing deposition of material on the nearby lens elements 46, 50 and 54 of the extraction objective lens 42. This minimization of material deposition is accomplished by forming one or more of the lens elements 46, 50 and 54 into appropriately shaped structures. For example, as best shown in FIGS. 1 and 2 the lens elements 46, 50 and 54, each comprises truncated conical structures, minimizing the surface area exposed to the flux of particles emanating from the area including the sample 14. In particular, the lens element 46 nearest the sample 14 has a leading knife edge 108 for the conical structure, which further reduces the surface area exposed to the particle flux from the area, including the sample 14. The thicker structure used for the lens element 50 is designed to reduce the secondary electron emission which can arise from operation at a high negative electric field potential. However, since the redeposition problem rapidly diminishes with distance from the sample 14, any redeposition problem associated with the lens element 50 is much less than associated with the closer lens element 46.

The redeposition problem is further minimized by control of the electric field potential applied to the extraction objective lens 42. In the illustrated embodiment the electric field potential applied to the lens element 46 nearest the sample 14 is higher than the electric field potential on the sample 14, as opposed to the previously mentioned secondary ion mass spectrometer (SIMS), wherein the electric field potential is strongly negative with respect to the sample 14. The result is the flux of contaminant ions able to reach the lens element 46 is substantially limited in the present invention.

The extraction objective lens 42 and the collimator lens system 84 cooperate to extract neutral atomic components, which have been ionized by the laser beam pulse 34. The elements 85, 86 and 87 of the collimator lens system 84 comprise a set of conventional aperture einzel lenses. The extraction objective lens 42 and the collimator lens system 84 act to transform the trajectory pattern of the selected atomic component ejected from the sample 14 into a highly collimated ion beam 88 (hereinafter, the "ion beam 88") traveling along a third path 90. Thus, the extraction objective lenses 42 and 84 not only function to focus the primary ion beam 18 onto the sample 14, but also operate to extract the photo ions and provide the necessary collimation for subsequent quantitative EARTOF analysis. Lens element systems 94 and 98 provide additional focusing of the ion beam 88 prior to input to energy analyzer means, such as electrostatic analyzers 102 and 104 shown in FIGS. 1 and 6.

The EARTOF quantitative analysis of the illustrated embodiment is performed in a spectrometer detector region 105 using the electrostatic analyzers 102 and 104 and an associated telescopic lens 110. The construction of this portion of the spectrometer 10 allows the reduction of the spread in time-of-flight for the ions undergoing analysis and includes structural features which attenuate various sources of noise, with both features leading to improved detection sensitivity. Another important feature is the use of 180° sections for the electrostatic analyzers 102 and 104 which provides a significant refocusing feature. Thus, for those ions having an angular deviation from perpendicularity with respect to the entry window plane of the electrostatic analyzer 102, the impact point at the exit window plane occurs very close to that of an ideal orbit. As a consequence, quite small entry window sizes can be utilized, and an improved attendant energy resolution results. The electrostatic analyzers 102 and 104 are constructed as 180° spherical electrostatic deflectors generating electric field potentials for energy analyzing the ion beam 88. These features give rise to the energy and angular refocusing properties of the illustrated EARTOF mass spectrometer.

Figure 7:
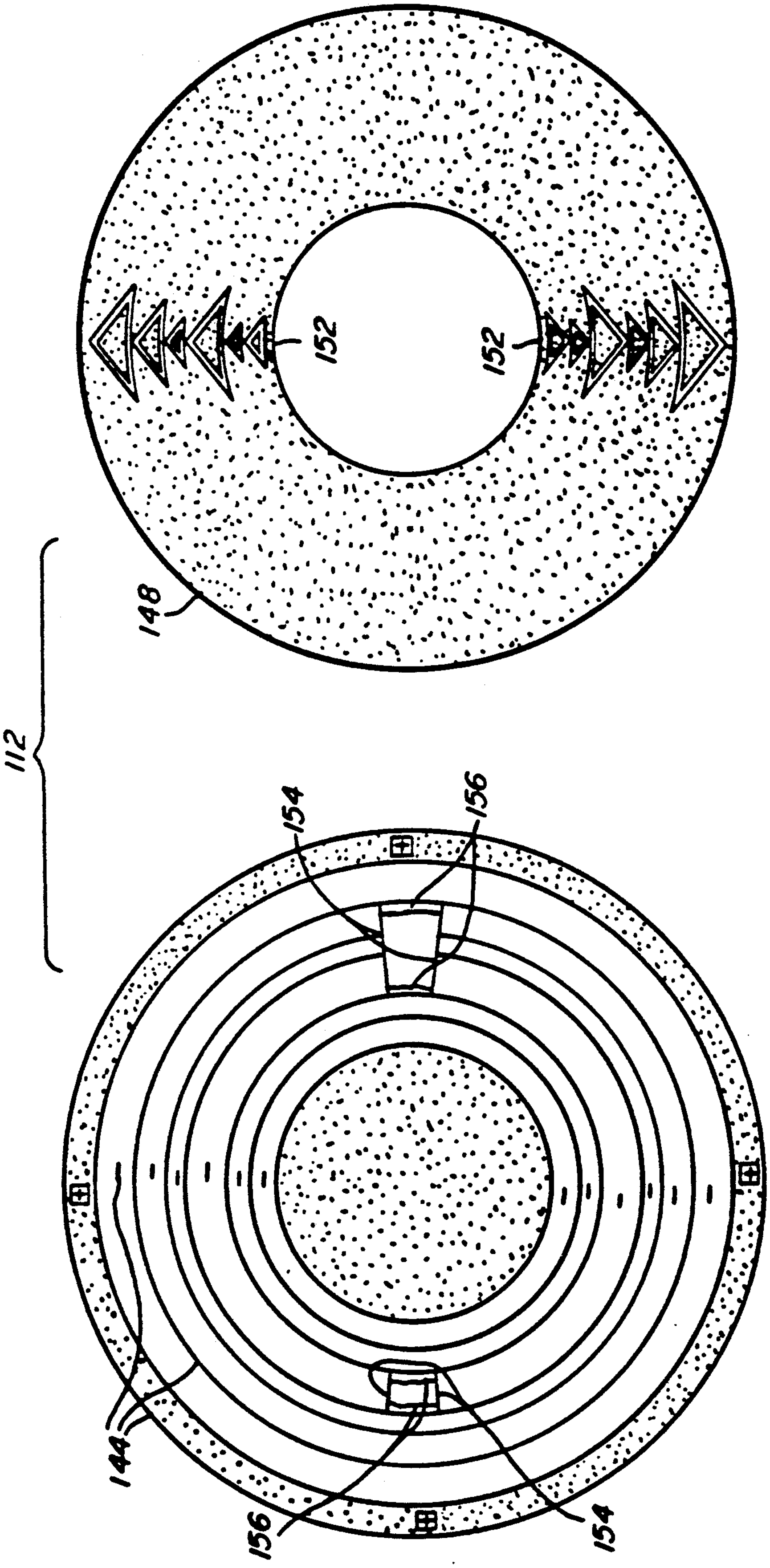
FIG. 7 shows a plan view of an example of the components of a preselected thick film configuration on an insulator substrate.

The electrostatic analyzers 102 and 104 include resistive disk means, such as a flat resistive disk boundary plate 112 (hereinafter, "resistive plate 112") shown in a plan view of FIG. 7. The resistive plate 112 is disposed between an inner conducting hemisphere 116 and an outer conductor 120. Details of functionality of the resistive plate 112 and its method of manufacture will be discussed hereinafter. In the preferred embodiment, the outer conductor 120 is a conducting hemisphere shape, but in another form of this invention the outer conductor 120 can be a metallic band about the circular perimeter of the resistive plate 112. The outer conductor 120 is preferably constructed of a highly transparent metal mesh formed into the hemispherical shape. The open nature of the metal mesh minimizes the probability that ions uncharacteristic of the selected atomic component and which have escape trajectories leading out of the electrostatic analyzers 102 and 104 will be detected by a detector 106.

The ion beam 88 is input to the electrostatic analyzer 102 through a first entry window 124 which can be relatively narrow as discussed hereinbefore. A point focus of the ion beam 88 can be used advantageously to provide good energy resolution, thus minimizing energy variations resulting from the ions entering the electrostatic field off center. In addition this feature minimizes electric field fringe distortions whose magnitude is approximately proportional to the size of the opening of the entry window 124. In a similar manner a second exit window 136 of the electrostatic analyzer 104 has a relatively narrow opening, which gives rise to the same types of advantages attendant the narrow opening of the first entry window 124. The electrostatic analyzers 102 and 104 both have relatively large radial gaps between the inner conducting hemisphere 116 and the outer conductor 120. This relatively large radial gap accommodates a large range of charged particle energies within the energy analysis bandpass of the electrostatic analyzers 102 and 104, thereby improving the total collected signal and the signal to noise ratio.

A first exit window 128 and a second entry window 132 (see FIGS. 1 and 6A) both have relatively wide openings to accommodate the angularly divergent ions having different energies associated therewith. The electric field equipotentials near the various windows are, however, substantially ideal as a consequence of using the resistive plate 112 (see FIGS. 6A and 7), which provides predetermined electric field boundary conditions to achieve the required electric field potential. Structural details and a method of preparation of the resistive plate 112 will be discussed hereinafter.

Figure 6A:
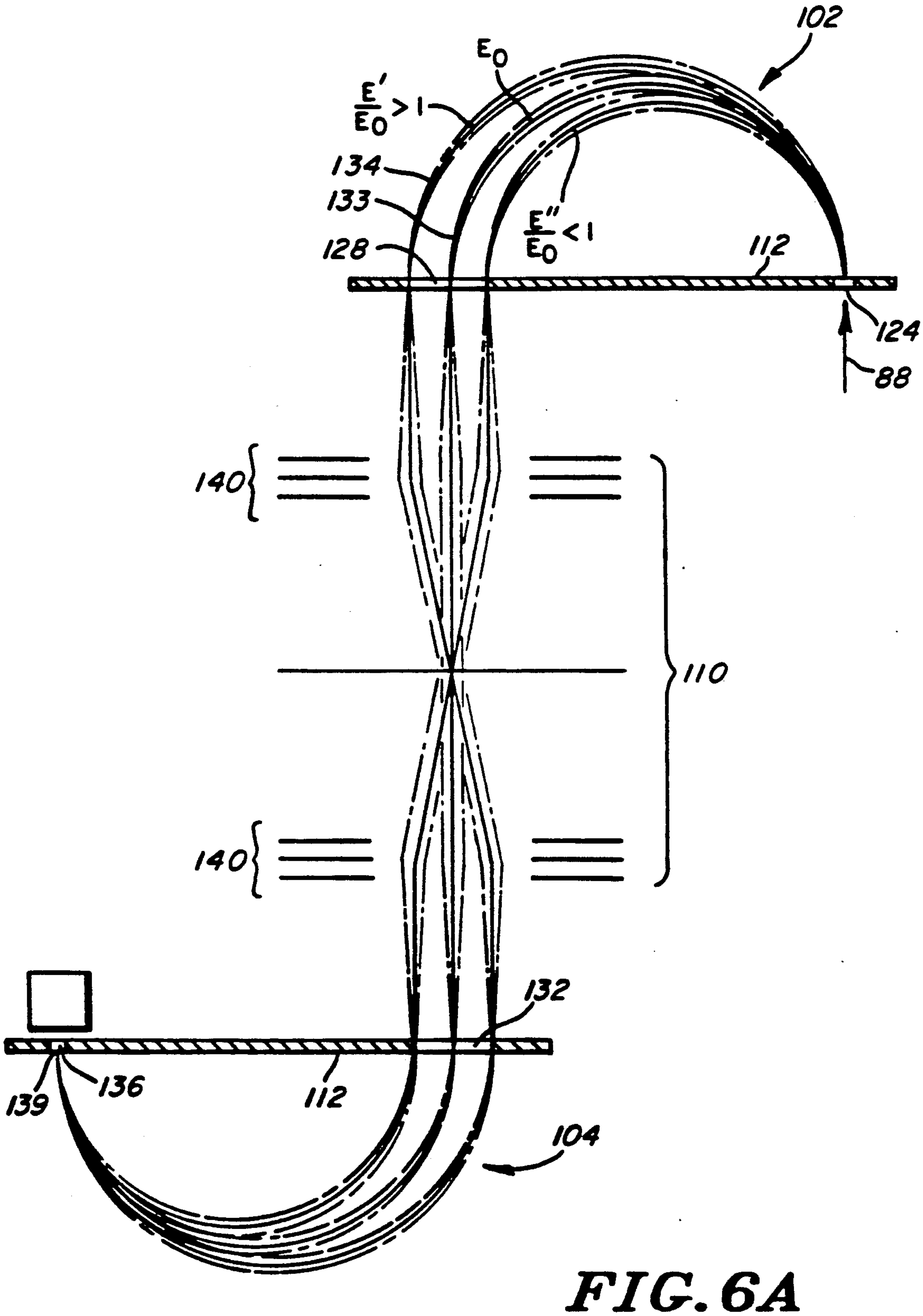
FIG. 6A depicts the orbits in the electrostatic analyzer of ions having various energies and FIG. 6B illustrates the orbits of ions entering at different angles with the same energy.
Figure 6B:
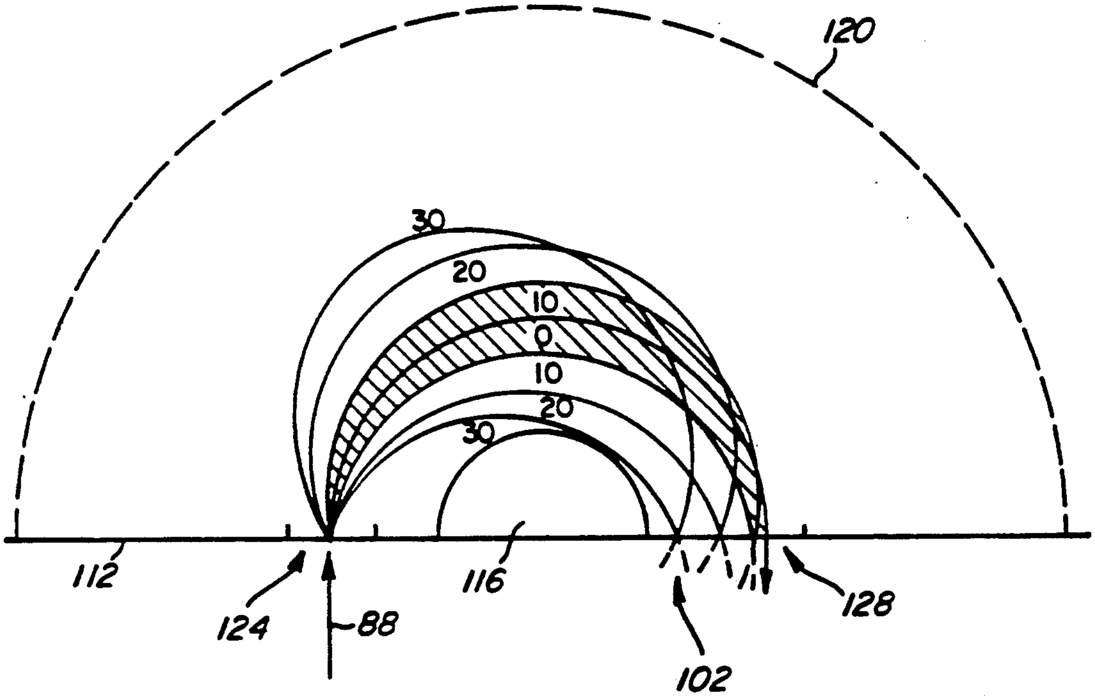

The orbits of the ions vary with kinetic energy, and for a particular electric field potential and kinetic energy, $E_0$, a circular orbit 133 is defined (see FIG. 6A). Therefore, for those ions having larger kinetic energy $E'$, such that $E'/E_0 > 1$, an orbit 134 is elliptical and has a larger arc terminating on the outer edge of the first exit window 128. Likewise for $E'/E_0 > 1$, a smaller arc terminates on the inner edge of the first exit window 128. If the orbits of the ions were allowed to complete a 360° arc, the known properties of trajectories in a $1/r$ electric field potential would indicate the return of the ion to the same starting point for ion energies below the energy escape values.

Furthermore, the time to complete one orbit for ions having substantially the same energy, but entering the electrostatic analyzer 102 with an angular deviation from the perpendicular to the plane of the first entry window 124, is weakly dependent on the angle of deviation for small angles of deviation. For the 180° spherical electrostatic analyzer 102, there is a focus at the plane of the exit window 128 and beyond that plane, the particle orbits diverge in the manner illustrated in FIG. 6B. Also, note the ions having orbits deviating from the perpendicular to the plane do not pass through the plane of the exit window 128 at the center of the exit window 128, but rather pass inside the center. However, as seen in FIG. 6A, this result is avoided in the electrostatic analyzers 102 and 104 by including the telescopic refocusing lens system 110 (hereinafter "lens system 110"). The components of the lens system 110 include two electrostatic lens sets 140, which are identical to one another in the preferred embodiment. More particularly each of the lens sets 140 are aperture einzellenses utilizing central elements at negative electric field potential.

The resistive plate 112, together with the inner conducting hemisphere 116 and the outer 120 conductor, performs the function of a spherical electrostatic prism which provides predetermined electric field boundary conditions to achieve the stringent electric field potential required for the electrostatic analyzers 102 and 104. In order to maintain precise control of the high energy (kV level) ions and thereby isolate the desired signal from unwanted signals and noise, kV level voltages are usually applied across the resistive plate 112 to achieve the desired deflecting forces. The resistive plate 112 is also operated in a vacuum, and to maintain this vacuum the material should exhibit low vapor pressure, even when heat is generated during use. The resistive plate 112 also should be able to readily dissipate heat generated in order to avoid significant dimensional changes and possible material failure. These operating features make difficult the manufacture of the resistive plate 112 from bulk materials of the appropriate high resistivity. In the embodiment illustrated in FIG. 7, the resistive plate 112 comprises an insulator substrate 144, such as machinable glass ceramic of very high resistivity. Disposed on the insulator substrate 144 is a preselected thick film configuration 148 having selected electrical resistivity characteristics enabling generation of the previously mentioned predetermined electric field boundary conditions, responsive to an electrical current applied to the preselected thick film configuration 148. The resistive plate 112 therefore serves to provide substantially ideal electric field boundary conditions between the inner conducting sphere 116 and the outer conductor 120 of the electrostatic analyzers 102 and 104.

The manufacture of the resistive plate 112 involves deposition of resistive thick films using screen printing methods. In the preferred embodiment the resistive thick film is derived from an oxide paste, such as a bismuth-rutherium oxide based material manufactured under the trade name of "BIROX" by Du Pont Corp. The oxide paste is applied to the insulator substrate 144 through a prepared mask screen (not shown). The screen printing method enables deposition of thick films with complex spatial patterns to accommodate the desired predetermined electric field boundary conditions. Metallic pastes are also applied to the insulator substrate 144 to establish an electrode contact for applying electric current to the resistive portion of the preselected thick film configuration 148.

To achieve the predetermined electric field boundary conditions, given the shapes of the entry windows 124 and 132 and the exit windows 128 and 136 for the electrostatic analyzers 102 and 104, respectively, the fabrication steps are: (1) prepare the correct shape and size of the insulator substrate 144 suitable for depositing the thick films thereon, (2) apply a thin conducting Ag/Pd based paste 156 to the insulator substrate 144, (3) firing the insulator substrate 144 at a temperature appropriate to achieve the desired electrical and mechanical properties, typically about 800° C. with the conductive thick film configuration applied from step two above, (4) applying through the mask screen a resistive oxide paste (such as BIROX) to form an annular and spherical triangle configuration 152 shown in FIG. 7; also a thin layer 154 of the resistive oxide paste is applied to the upper and lower surfaces of the entry windows 124 and 132 and the exit windows 128 and 136, and (5) firing the assembly to form the final, fixed high electrical resistivity for the preselected thick film configuration 148. The design of the preselected thick film configuration 148 is based on the geometry of the electrostatic analyzer 102 or 104, including the shape and size of the various windows. Calculation of the desired form of the preselected thick film configuration 148 is achievable using specialized mathematical analysis developed for this purpose.

In another form of the invention the general ability to provide predetermined electric field boundary conditions using the preselected thick film configuration 148 has general applications. These applications arise when there is a need for electric field means generating an undistorted electric field potential, particularly near structural anomalies, such as holes and protrusions. Important applications also arise for instances when electric field regions are defined by irregular shapes and in cases where the designer wishes to modify selected portions of the electric field.

An additional feature of the spectrometer 10 is the application of a coating applied to reduce or minimize effects of using radiation beams in the spectrometer 10. For example, there can be a buildup of excess charge on portions of the spectrometer 10, causing electrostatic anomalies which deflect various charged particles away from desired trajectories and even causing damage preferentially to selected locations.

In another form of the invention coatings can be applied which are particularly resistant to laser ionization and are typically used on conductive elements near the sample 14. This type of coating is applied to selected portions of various ones of the lens system elements of the spectrometer 10. Examples of ionization resistant coatings comprise metals which include: Au, Ag, Cu, Pd, Pt, Ru, Sn, Y and Zr. Other materials also can be utilized to reduce detrimental effects and are compatible with the performance specifications of the spectrometer lens system, while performing in accordance with the desired coating requirements. The preferred gold coating is applied to the selected lens element to provide protection from interactions with various radiation beams, such as the laser beam pulse 34, the primary radiation beam 18 and any secondary ions, including the selected atomic components.

OTHER EXAMPLE MODES OF OPERATION OF THE SPECTROMETER

Because of its unique design, the spectrometer 10 can be operated in a variety of modes, thus making it a versatile instrument for determining surface properties of the sample 14. For example, in the SIMS operating mode, mass spectrometric studies of sputtered secondary ions are carried out. Removal of material from the surface of the sample 14 by beams of atoms, ions, electrons or by photon beam bombardment or by fission fragments (plasma desorption mass spectrometry), results in the ejection of a certain fraction of the sample 14 in the form of secondary ions. The spectrometer 10 can be operated in the SIMS mode, leaving the sample 14 at a fixed potential and dispensing with the laser pulses 34.

Positive and negative secondary ions can be mass analyzed and detected using the electrostatic analyzers 102 and 104 and the associated resistive plate 112.

In another form of the invention the spectrometer 10 is operated in the Ion Scattering Spectroscopy ("ISS") mode. The ISS mode is an important method for obtaining surface composition and adsorbate structural information on the sample 14. The design of the spectrometer 10 allows it to be operated as an ISS instrument by taking advantage of the fact that the incoming primary ion beam 18 is directed normal to the sample 14, while the path of ion travel during time of flight measurements is along the third path 90, also normal to the sample 14. In the ISS mode the resistive plate 112 is switched off while an ion detector 160 shown in FIG. 1 is activated to detect the ion beam 88 allowed to pass thereto (See FIG. 1). Back scattered ions from the primary ion beam 18 are energy analyzed in the time of flight portion of the spectrometer by measuring their arrival time at the ion detector 160 in a conventional manner.

In addition to functioning as positive and negative ion energy analyzers, the electrostatic analyzers 102 and 104, along with the resistive plate 112, are adapted to function as electron energy analyzers. They therefore can be used for generally performing charged particle energy analysis, including energy analysis of Auger, X-ray photoelectron, ultraviolet photoelectron and synchrotron radiation photoelectron spectroscopy. Provisions for appropriate sample illumination devices such as electron guns, X-rays or U.V. photon sources can be made in a conventional manner. The following example is merely illustrative.

EXAMPLE

The preferred embodiment has been used to perform depth profiling analyses on high purity silicon wafers which had been implanted with $^{56}Fe$ at an energy of 60 kV. This chemical system was chosen to illustrate advantages of analysis for the spectrometer 10 over conventional SIMS which experiences problems associated with the substantial mass equivalent of the Fe and $Si_2$ dimer species. Both of these atomic components appear at the nominal mass fifty-six position.

In the measurements cited here, the Fe concentration at the peak of the concentration profile vs. depth was reliably estimated at 400 ppb through the use of standard ion implantation range data. Based on that calibration, the following data were measured in the spectrometer 10.

| | |
|---|---|
| | Principal Results |
| Sensitivity limit: | <2 ppb for $^{56}Fe$ impurity in silicon<br>0.5 ppb for $^{54}Fe$ impurity in silicon |
| Collection efficiency: | About 8% (atoms detected per atom removed from sample) |
| | Measurement Parameters |
| Ion beam area: | 0.05 $mm^2$ |
| Ion beam current: | 2 μA |
| Ion beam energy: | 5 kV |
| Measurement time: | 1000 seconds |
| Monolayers removed: | 0.86 |
| Signal/noise: | 1 |
| Raster area: | 4 $mm^2$ |

While preferred embodiments of the present invention have been illustrated and described, it will be understood that changes and modifications can be made therein without departing from the invention in its broader aspects. Various features of the invention are defined in the following claims.

What is claimed is:

1. A device for providing predetermined electrical field boundary conditions for achieving a required electric field potential shape arising principally from an electric field means, comprising:
   an insulator substrate;
   means for applying an electrical current; and
   a preselected thick film configuration disposed on said insulator substrate and coupled to said electric field means, said thick film configuration having a two dimensional pattern of selected substantially, uniform electrically resistive character in selected spatial pattern areas, enabling provision of said predetermined electric field boundary conditions responsive to said electrical current applied to said thick film configuration.

2. A thick film structure on a substrate for providing predetermined electric field boundary conditions for modifying an electric field potential generated by electric field means, comprising:
   an insulator substrate;
   means for applying an electrical current; and
   a preselected thick film configuration disposed on said insulator substrate in a two dimensional spatial pattern generates said predetermined electric field boundary conditions responsive to said electrical current applied to said thick film configuration and said spatial pattern having selected, substantially uniform electrically resistive character within selected defined areas thereof.

3. A thick film structure for providing predetermined electric field boundary conditions by modifying electric field potential gradients generated by electric field means, comprising:
   a substrate for receiving said thick film structure;
   means for applying an electrical current to said thick film structure; and
   a preselected thick film configuration disposed on said substrate to form said thick film structure, said thick film configuration comprised of a selected two dimensional spatial pattern having selected, substantially uniform electrically resistive character within selected defined areas of said two dimensional spatial pattern and said preselected thick film configuration generating said predetermined electric field boundary conditions responsive to said electrical current.

4. A thick film structure for modifying electric field potentials generated by electric field means to provide predetermined electric field boundary conditions around a geometrical shape, comprising:
   a substrate for receiving said thick film structure;
   means for applying an electrical current to said thick film structure; and
   a preselected thick film configuration disposed on said substrate to form said thick film structure, said thick film structure comprised of a selected two dimensional spatial pattern for achieving said predetermined electric field boundary conditions in the presence of said geometrical shape and having selected, substantially uniform electrically resistive character within selected defined areas of said two dimensional spatial pattern with said thick film configuration generating said predetermined electric field boundary condtions responsive to said electrical current.

5. The thick film structure as defined in claim 4 wherein said geometrical shape comprises at least one of a protrusion and a hole.

* * * * *